(12) United States Patent
Bonomo et al.

(10) Patent No.: US 7,193,854 B2
(45) Date of Patent: Mar. 20, 2007

(54) USING A LEAF SPRING TO ATTACH CLAMP PLATES WITH A HEAT SINK TO BOTH SIDES OF A COMPONENT MOUNTED ON A PRINTED CIRCUIT ASSEMBLY

(75) Inventors: Paul Bonomo, Loveland, CO (US); John Andberg, Santa Cruz, CA (US)

(73) Assignee: Verigy Pte. Ltd, Singapore (SG)

( * ) Notice: Subject to any disclaimer, the term of this patent is extended or adjusted under 35 U.S.C. 154(b) by 128 days.

(21) Appl. No.: 11/120,671

(22) Filed: May 2, 2005

(65) Prior Publication Data
US 2006/0245166 A1   Nov. 2, 2006

(51) Int. Cl.
*H05K 7/20* (2006.01)

(52) U.S. Cl. .................. 361/719; 361/698; 361/699; 361/711; 361/719; 361/715; 257/714; 165/80.4; 174/15.1

(58) Field of Classification Search ................ 361/689, 361/698, 699, 700–712, 714, 719, 715; 257/714, 257/715, 722–727; 165/80.3, 80.4, 104.26, 165/104.33, 46, 185; 174/15.1, 16.2, 252; 62/259.2; 248/316.7, 505, 510
See application file for complete search history.

(56) References Cited

U.S. PATENT DOCUMENTS

| | | | | |
|---|---|---|---|---|
| 5,144,532 A | * | 9/1992 | Wessely et al. | ............ 361/702 |
| 6,116,331 A | * | 9/2000 | Tustaniwskyj et al. | .... 165/80.4 |
| 6,222,734 B1 | * | 4/2001 | Bookhardt et al. | ......... 361/719 |
| 6,381,136 B1 | * | 4/2002 | Nelson et al. | ............. 361/704 |
| 6,724,629 B1 | * | 4/2004 | Augustin et al. | ........... 361/704 |
| 6,934,154 B2 | * | 8/2005 | Prasher et al. | ............. 361/699 |
| 7,106,594 B2 | * | 9/2006 | Vetter et al. | ................ 361/719 |

* cited by examiner

Primary Examiner—Michael Datskovskiy

(57) ABSTRACT

A heat sink assembly for cooling a component is disclosed, the heat sink assembly comprising a printed circuit board; a clamp plate; a waterblock cooling device; and a force attachment component to attach the clamp plate and the waterblock cooling device with the printed circuit board in contact with the waterblock cooling device and the clamp plate. A method is disclosed for connecting together a heat sink assembly and a component, the method comprising inserting standoffs of a clamp plate through passage holes in a printed circuit board; inserting the standoffs of the clamp plate through clearance holes in a waterblock cooling device; and positioning a spring component in contact with the clamp plate and the waterblock cooling device so as to position the printed circuit board in contact with the waterblock cooling device and the printed circuit board in contact with the clamp plate.

23 Claims, 16 Drawing Sheets

USING A LEAF SPRING TO ATTACH CLAMP PLATES WITH A HEAT SINK TO BOTH SIDES OF A COMPONENT MOUNTED ON A PRINTED CIRCUIT ASSEMBLY

BACKGROUND

Heat sinks are attached to various types of components to provide temperature regulation. One issue concerns clamping pressure applied by the heat sink to the one or more components. It is difficult to apply pressure to both sides of the one or more components without crushing the components.

SUMMARY OF THE INVENTION

In one embodiment, there is provided a heat sink assembly for cooling a component, the heat sink assembly comprising a first clamp plate having a pair of standoffs, the pair of standoffs extending from a side of the first clamp plate that is configured to mate to a first side of a printed circuit board on which the component is mounted; a second clamp plate having a side that is configured to mate to a second side of the printed circuit board, the second clamp plate having a pair of holes therein to receive the pair of standoffs extending from the first clamp plate; and a spring component having a pair of holes to receive the pair of standoffs, the spring component being attached to the second clamp plate at a location between the spring component's pair of holes, the spring component retaining the pair of standoffs to clamp the printed circuit board between the first and second clamp plates; wherein at least one of the clamp plates is configured to contact the component and sink heat from the component.

In another embodiment, there is provided a heat sink assembly for cooling a component, the heat sink assembly comprising a printed circuit board having a first side and a second side in opposition to one another, a top portion of the component extending outwardly from the first side of the printed circuit board; a clamp plate having a third side and a fourth side in opposition to one another, wherein the third side of the clamp plate and the second side of the printed circuit board are configured for disposition toward one another; a waterblock cooling device having a fifth side and a sixth side in opposition to one another; and a force attachment component configured to attach the clamp plate and the waterblock cooling device to one another with the first side of the printed circuit board in contact with the waterblock cooling device and the second side of the printed circuit board in contact with the clamp plate.

In another embodiment, there is provided a heat sink assembly for cooling a component, the heat sink assembly comprising a printed circuit board having a first side and a second side in opposition to one another, a top portion of the component extending outwardly from the first side of the printed circuit board, and the printed circuit board forming a first pair of passage holes therethrough between the first side and the second side, and the printed circuit board forming a second pair of passage holes therethrough between the first side and the second side; a clamp plate having a third side and a fourth side in opposition to one another, a first pair of standoffs comprising a first standoff and a second standoff, a second pair of standoffs comprising a third standoff and a fourth standoff, each one of the first pair of standoffs and the second pair of standoffs extending outwardly from the clamp plate, each one of the first pair of standoffs and the second pair of standoffs having a terminal end disposed away from the third side of the clamp plate, and each one of the first pair of standoffs and the second pair of standoffs having an attachment portion between the terminal end thereof and the clamp plate, wherein the third side of the clamp plate and the second side of the printed circuit board are configured for disposition toward one another so as to position the first pair of standoffs through the first pair of passage holes of the printed circuit board and position the second pair of standoffs through the second pair of passage holes of the printed circuit board; a waterblock cooling device having a fifth side and a sixth side in opposition to one another, the waterblock cooling device forming a first pair of clearance holes therethrough between the fifth side and the sixth side, the waterblock cooling device forming a second pair of clearance holes therethrough between the fifth side and the sixth side, the first pair of clearance holes configured to allow the terminal end of each one of the first pair of standoffs of the clamp plate to pass therethrough, the second pair of clearance holes configured to allow the terminal end of each of the second pair of standoffs of the clamp plate to pass therethrough, a first central retainer extending away from the fifth side of the waterblock cooling device, a second central retainer extending away from the fifth side of the waterblock cooling device, a terminal end of the first central retainer disposed away from the waterblock cooling device, a terminal end of the second central retainer disposed away from the waterblock cooling device, the first central retainer disposed between the first pair of clearance holes, the second central retainer disposed between the second pair of clearance holes; and a first spring component and a second spring component, each of the first spring component and the second spring component having a first end and a second end in opposition to one another, each of the first spring component and the second spring component forming a first keyhole cutout adjacent the first end, a second keyhole cutout adjacent the second end, and a central hole between the first keyhole cutout and the second keyhole cutout, the first keyhole cutout and the second keyhole cutout each having a first portion and a second portion, the first portion forming a first given opening, the second portion forming a second given opening, and the first given opening sized larger than the second given opening, the central hole of the first spring configured to receive therethrough the terminal end of the first central retainer, the first keyhole cutout of the first spring component configured to receive therethrough the terminal end of one of the first pair of standoffs, the second keyhole cutout of the first spring configured to receive therethrough the terminal end of another one of the first pair of standoffs, and the central hole of the second spring configured to receive therethrough the terminal end of the second central retainer, the first keyhole cutout of the second spring configured to receive therethrough the terminal end of one of the second pair of standoffs, the second keyhole cutout of the second spring configured to receive therethrough the terminal end of another one of the second pair of standoffs.

In still another embodiment, a method is provided for connecting together a heat sink assembly and a component, the method comprising inserting standoffs of a clamp plate through passage holes in a printed circuit board; inserting the standoffs of the clamp plate through clearance holes in a waterblock cooling device; and positioning a spring component in contact with the clamp plate and the waterblock cooling device so as to position one side of the printed circuit board in contact with the waterblock cooling device and the other side of the printed circuit board in contact with the clamp plate.

Other embodiments are also disclosed.

BRIEF DESCRIPTION OF THE DRAWINGS

Illustrative embodiments of the invention are illustrated in the drawings, in which.

DETAILED DESCRIPTION OF AN EMBODIMENT

Figure 1:
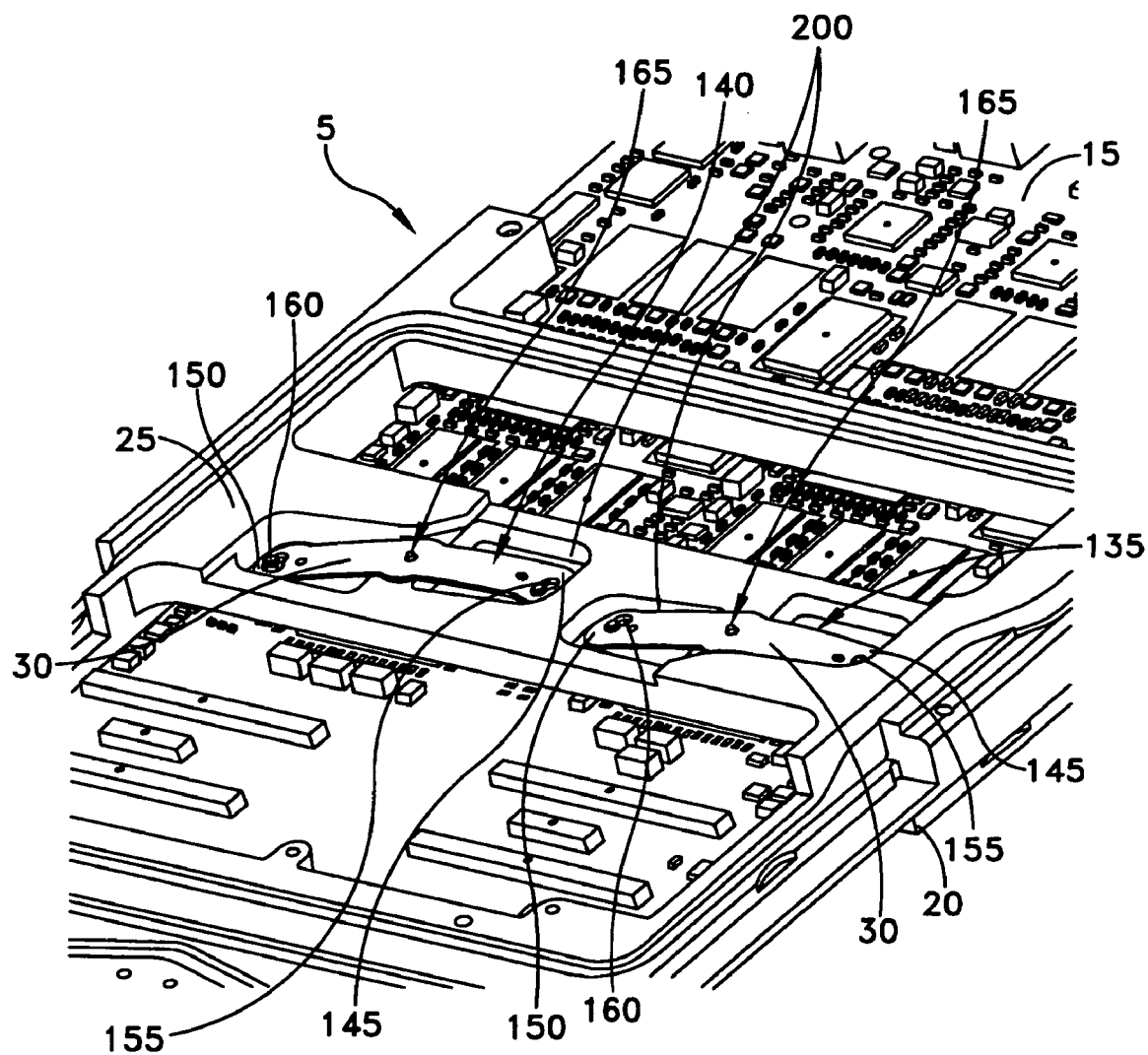
FIG. 1 illustrates an exemplary heat sink device in which there is provided two spring components for imparting a clamping force on a printed circuit board by a clamping plate and a waterblock cooling device.

In an exemplary embodiment, there is provided a heat sink assembly 5 for cooling a component 10. Heat sink assembly 5 includes a first clamp plate 20 having a pair of standoffs 75, the pair of standoffs 75 extending from a side 65 of first clamp plate 20 that is configured to mate to a first side 40 of a printed circuit board 15 on which component 10 is mounted. A second clamp plate 25 is provided having a side 100 that is configured to mate to a second side 35 of printed circuit board 15, second clamp plate 25 having a pair of holes 105 therein to receive the pair of standoffs 75 extending from first clamp plate 20. A spring component 135 is provided having a pair of holes 155, 160 to receive the pair of standoffs 75. Spring component 135 is attached to second clamp plate 25 at a location between the pair of holes 155, 160. Spring component 135 retains the pair of standoffs 75 to clamp printed circuit board 15 between first clamp plate 20 and second clamp plate 25. At least one of clamp plate 20 and clamp plate 25 is configured to contact component 10 and sink heat from component 10.

Figure 2:
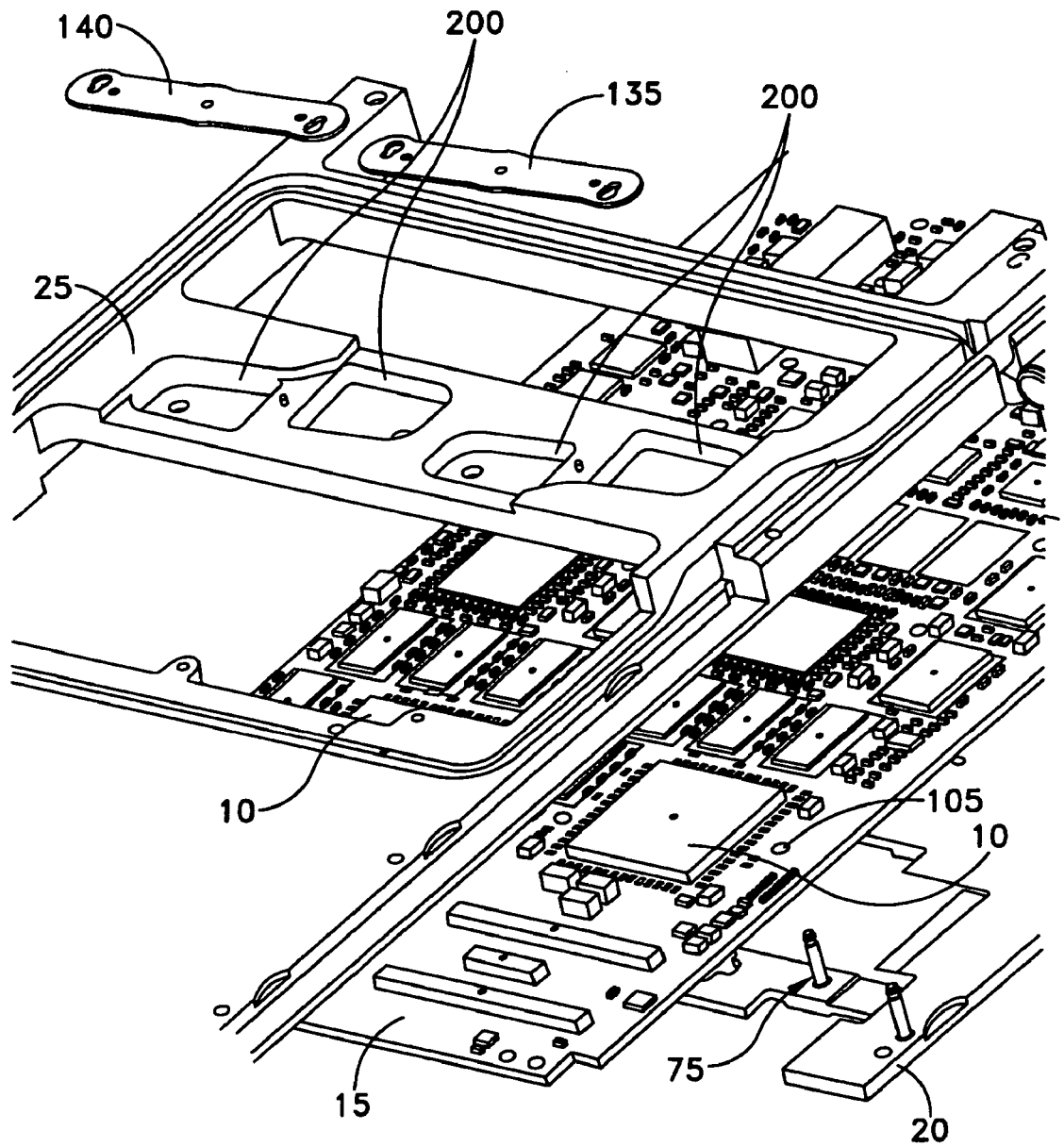
FIG. 2 illustrates an exploded view of the heat sink device shown in FIG. 1.

Referring to FIGS. 1 and 2, and in one embodiment, there is shown heat sink assembly 5 for cooling one or more components 10 (FIG. 2). Heat sink assembly 5 (FIG. 1) generally comprises printed circuit board 15 carrying one or more components 10, first clamp plate 20 for attachment to one side of printed circuit board 15, second clamp plate 25 configured as a waterblock cooling device 25 for attachment on the other side of printed circuit board 15, at least one force attachment component 30 configured to attach first clamp plate 20 and waterblock cooling device 25 together so as to impart a clamping force on printed circuit board 15. As disclosed herein below, waterblock cooling device 25 is provided as second clamp plate 25. However, in other embodiments of the present invention, second clamp plate 25 may include other various types of clamping components.

Figure 3:
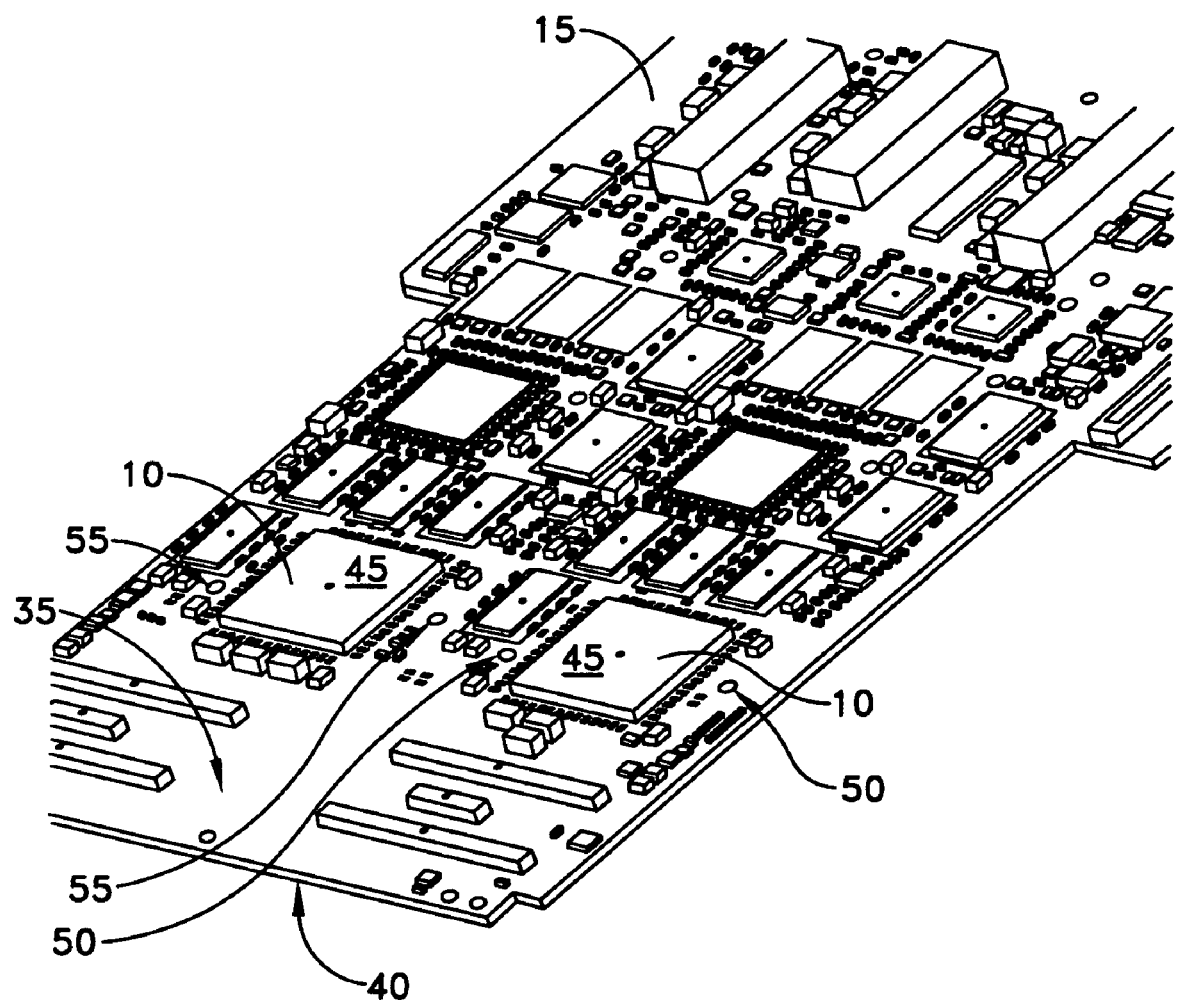
FIG. 3 illustrates a perspective view of the printed circuit board shown in FIG. 1.

Looking now at FIG. 3, there is shown printed circuit board 15 having a first side 35 and a second side 40 in opposition to one another. In one embodiment, two components 10 are disposed on first side 35 of printed circuit board 15. In another embodiment (not shown), heat sink assembly 5 is configured for use with a printed circuit board having a single component to be cooled mounted thereon. In other embodiments, heat sink assembly 5 is configured for use with a printed circuit board having three or more components to be cooled mounted thereon.

Referring again to FIG. 3, a top portion 45 of each of components 10 extends outwardly from first side 35 of printed circuit board 15. A first pair of passage holes 50 is formed on opposed sides of one of components 10 and passage holes 50 extend through printed circuit board 15 between first side 35 and second side 40. A second pair of passage holes 55 is formed on opposed sides of the other one of components 10 and passage holes 55 extend through printed circuit board 15 between first side 35 and second side 40. In one embodiment, at least one hole of one of the first pair of passage holes 50 and the second pair of passage holes 55 include an outer perimeter surrounded by printed circuit board 15. In another embodiment, at least one hole of one of the first pair of passage holes 50 and the second pair of passage holes 55 include a slot extending to an outer perimeter of printed circuit board 15.

Figure 4:
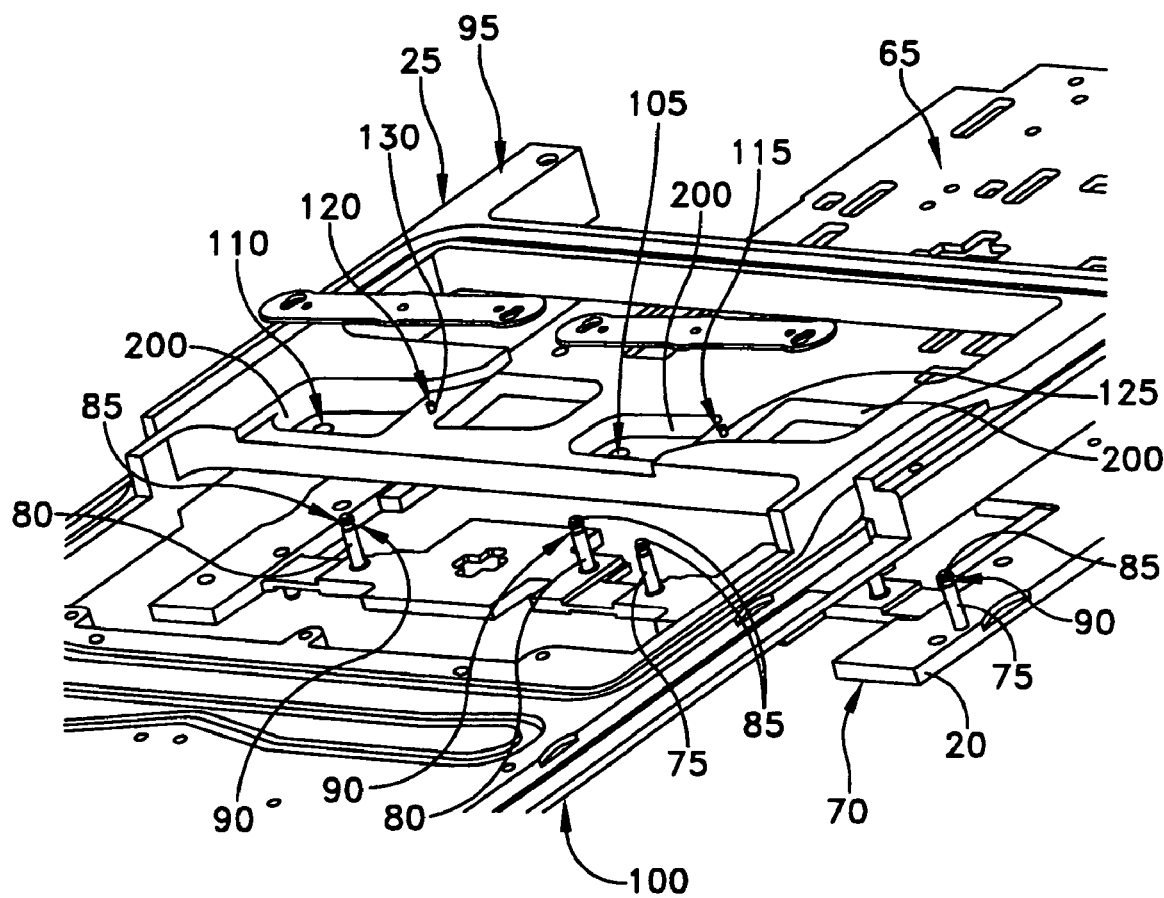
FIG. 4 illustrates another exploded view of the heat sink device shown in FIGS. 1 and 2.

Looking now at FIG. 4, and by way of example, there is shown a clamp plate 20 having a third side 65 and a fourth side 70 in opposition to one another. A first pair of standoffs 75 and a second pair of standoffs 80 extend outwardly from third side 65 of clamp plate 20. Each one of the standoffs has a terminal end 85 disposed away from third side 65 of clamp plate 20. An attachment portion 90 is provided between terminal end 85 of each standoff and clamp plate 20. In an exemplary embodiment, attachment portion 90 a necked down region between terminal end 85 and third side 65 of clamp plate 20.

Third side 65 of clamp plate 20 and second side 40 of printed circuit board 15 are preferably configured for disposition toward one another so as to position the first pair of standoffs 75 through the first pair of passage holes 50 of printed circuit board 15 and position second pair of standoffs 80 through the second pair of passage holes 55 of printed circuit board 15. Referring still to FIG. 4, there is shown a waterblock cooling device 25 having a fifth side 95 and a sixth side 100 in opposition to one another. Waterblock cooling device 25 preferably forms a first pair of clearance holes 105 through fifth side 95 and sixth side 100. Waterblock cooling device 25 preferably forms a second pair of clearance holes 110 through fifth side 95 and sixth side 100. First pair of clearance holes 105 is preferably configured to allow terminal end 85 of each one of the first pair of standoffs 75 of clamp plate 20 to pass through waterblock cooling device 25. Second pair of clearance holes 110 is configured to allow terminal end 85 of each of the second pair of standoffs 80 of the clamp plate 20 to pass through waterblock cooling device 25. In one embodiment, at least one hole of one of first pair of clearance holes 105 and second pair of clearance holes 110 comprises an outer perimeter surrounded by waterblock cooling device 25. In another embodiment, at least one hole of one of first pair of clearance holes 105 and second pair of clearance holes 110 include a slot extending to an outer perimeter of waterblock cooling device 25.

A first central retainer 115 and a second central retainer 120 each extend away from fifth side 95 of waterblock cooling device 25. A terminal end 125 of first central retainer 115 is disposed away from the waterblock cooling device. A terminal end 130 of second central retainer 120 is disposed away from waterblock cooling device. First central retainer 115 is disposed between the first pair of clearance holes 105. Second central retainer 120 is preferably disposed between the second pair of clearance holes 110.

Figure 12:
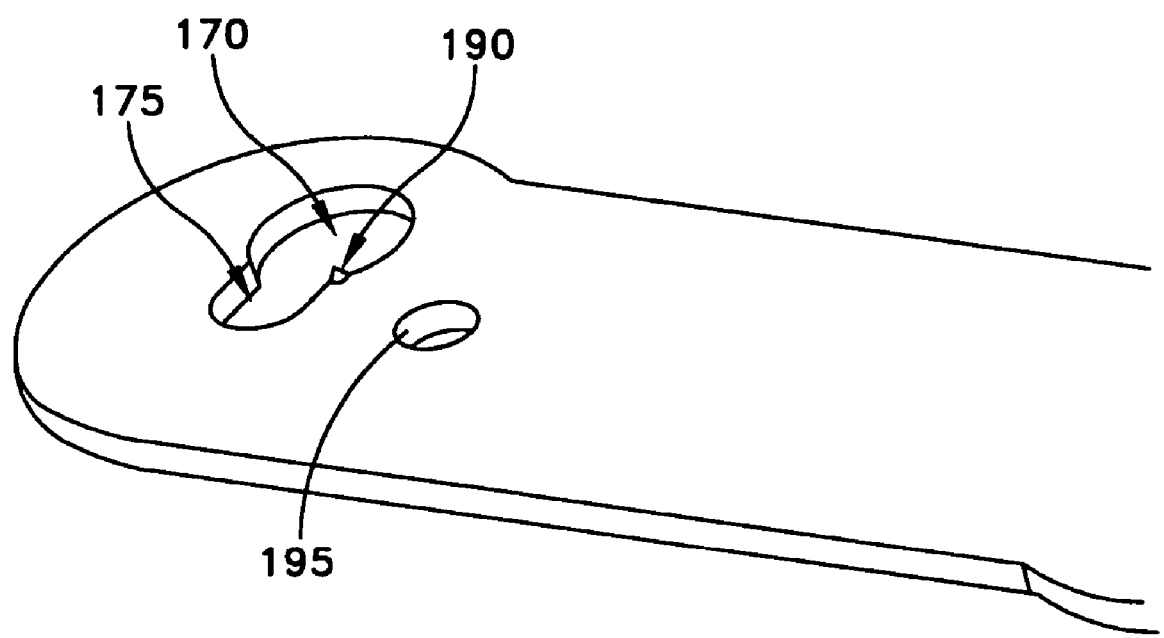
FIG. 12 illustrates an exemplary end of the spring component having a keyhole cutout, a locking nib, and a hole for engagement with an assembly tool.

Looking now at FIGS. 1 and 4, and in one embodiment, of the present invention, force attachment component 30 comprises a first spring component 135 and a second spring component 140, which each have a first end 145 and a second end 150 in opposition to one another, respectively. A first keyhole cutout 155 is formed adjacent first end 145. A second keyhole cutout 160 is formed adjacent second end 150. A central hole 165 is formed between first keyhole cutout 155 and second keyhole cutout 160. First keyhole cutout 155 and second keyhole cutout 160 each have a first portion 170 and a second portion 175 (FIG. 12). First portion 170 forms a first given opening, second portion 175 forms a second given opening, and the first given opening sized larger than the second given opening so as to selectively allow terminal end 85 of a standoff through first portion 170 but not through second portion 175.

Central hole 165 of first spring component 135 is configured to receive therethrough terminal end 125 of first central retainer 115. First keyhole cutout 155 of first spring component 135 is configured to receive therethrough terminal end 85 of one of the first pair of standoffs 75. Second keyhole cutout 160 of first spring component 135 is configured to receive therethrough terminal end 85 of the other one of the first pair of standoffs 75. Central hole 165 of second spring component 140 is configured to receive therethrough terminal end 85 of second central retainer 120. First keyhole cutout 155 of second spring component 140 is configured to receive therethrough terminal end 85 of one of the second pair of standoffs 80. Second keyhole cutout 160 of second spring component 140 is configured to receive therethrough terminal end 85 of another one of the second pair of standoffs 80.

In FIG. 3 there is shown printed circuit assembly 15 having a pair of high heat output components 10 mounted thereon. In one embodiment, components 10 on printed circuit assembly 15 are cooled by direct contact with water cooled plates 180 of waterblock cooling device 25 (FIGS. 5 and 6).

Components 10, or packages 10 as referred to herein below, are generally designed to have an air cooled heat sink attached to their top surface. In one embodiment, components 10 are cooled by having top surface 45 clamped against waterblock cooling device 25. In one embodiment, top surface 45 is clamped against water cooled plate 180, which may also be generally referred to as a cold plate. Waterblock cooling device 25 may comprise a metal material. By way of example, this metal may include aluminum.

Figure 5:
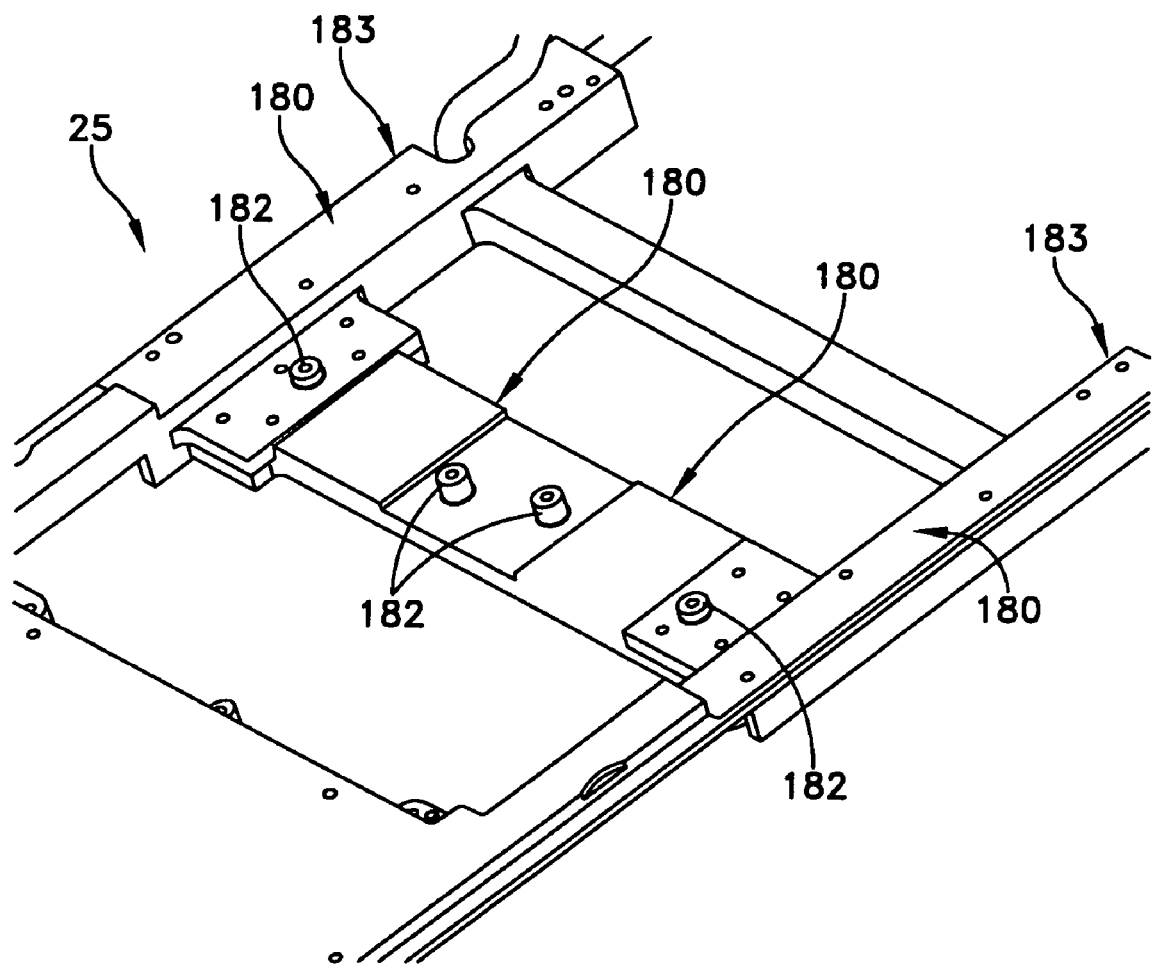
FIGS. 5 and 6 illustrate another waterblock cooling device configured to use screws for attachment to a clamping plate.
Figure 6:
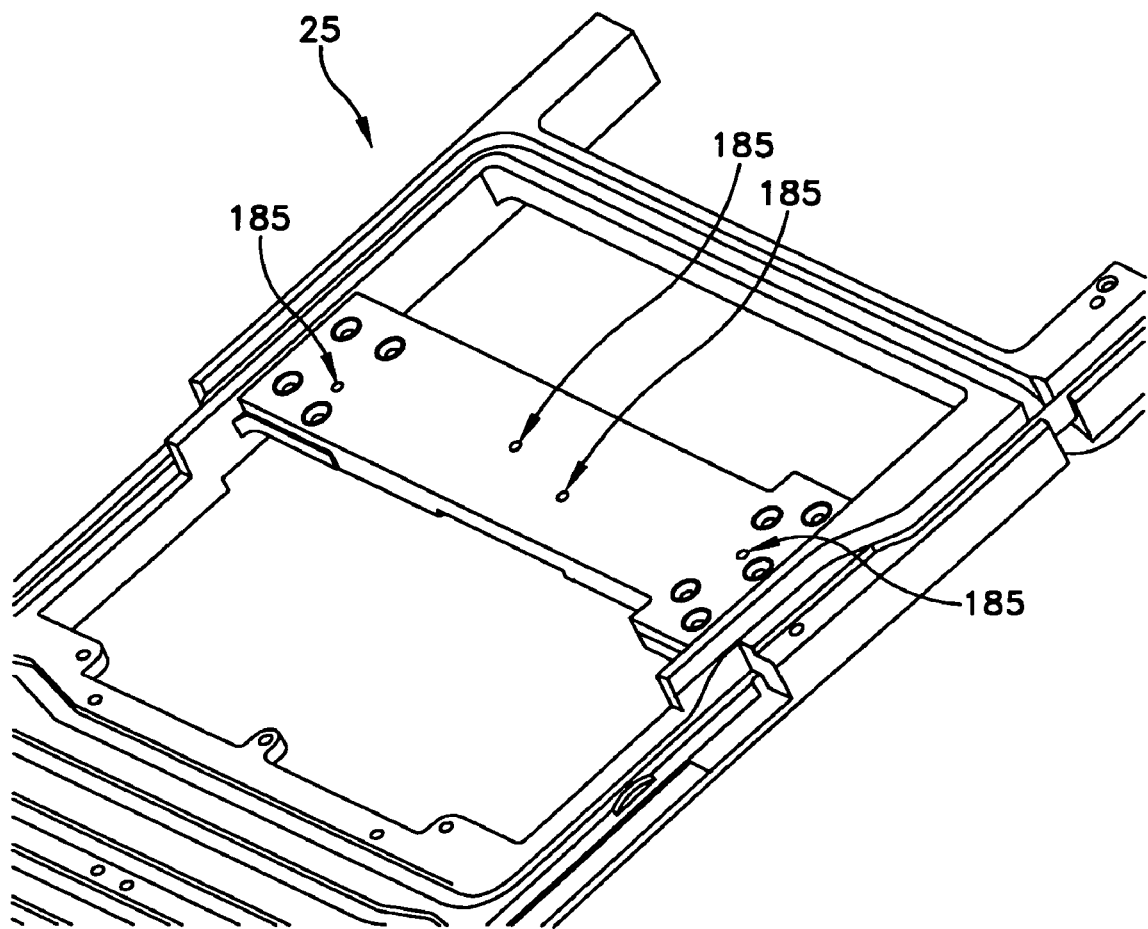

Looking at FIGS. 5 and 6, there is shown one embodiment of waterblock cooling device 25 in which screws are used for clamping force attachment component 30, although spring component 135 and spring component 140 may be configured for use in place of clamping force attachment component 30, and the underside of waterblock cooling device 25 preferably has thermal interface material 180 with standoffs 182 for vertical spacing. Four screws (not shown) may be used to join waterblock cooling device 25 and clamp component 20, which in turn compresses a metal plate (not shown) against the printed circuit board 15 carrying devices 10, which in turn is forced against thermal interface material 180 in a sandwich type arrangement. Thermal interface material 180 is provided at an outer location 183 for contact with portions of clamp component 20 to enable clamp component 20 to cool printed circuit board 15.

Figure 7:
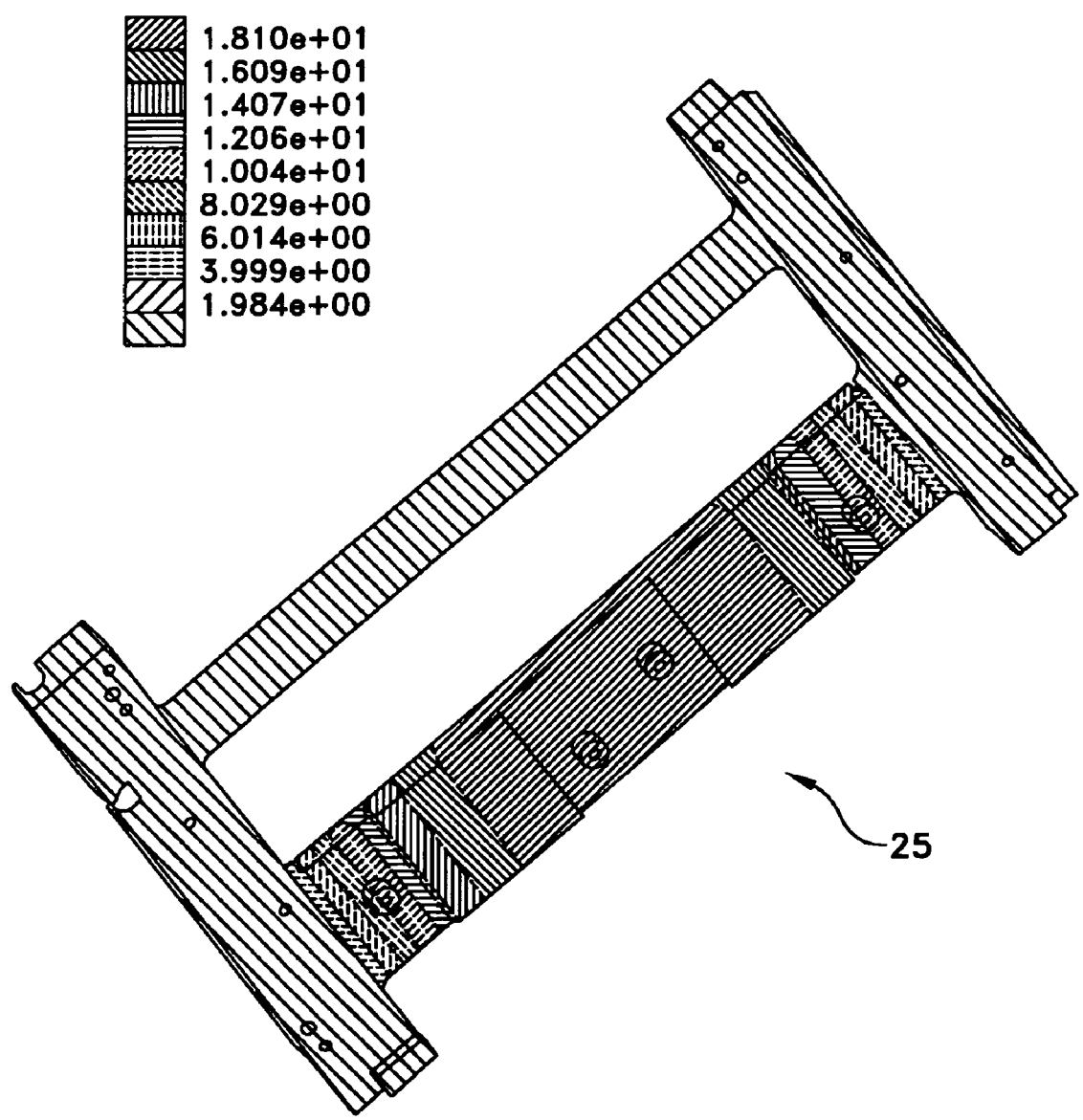
FIG. 7 illustrates the results of Finite Element Analysis (FEA) for the embodiment of waterblock cooling device with screws used for compression as shown in FIGS. 5 and 6.

In FIG. 7, there is shown the results of Finite Element Analysis (FEA) for the embodiment of waterblock cooling device 25 with screws used for compression. In one exemplary embodiment, the thermal resistance of the waterblock cooling device 25 with screws results in an average temperature rise of approximately 18° Celsius over the temperature of the cooling water.

Figure 8:
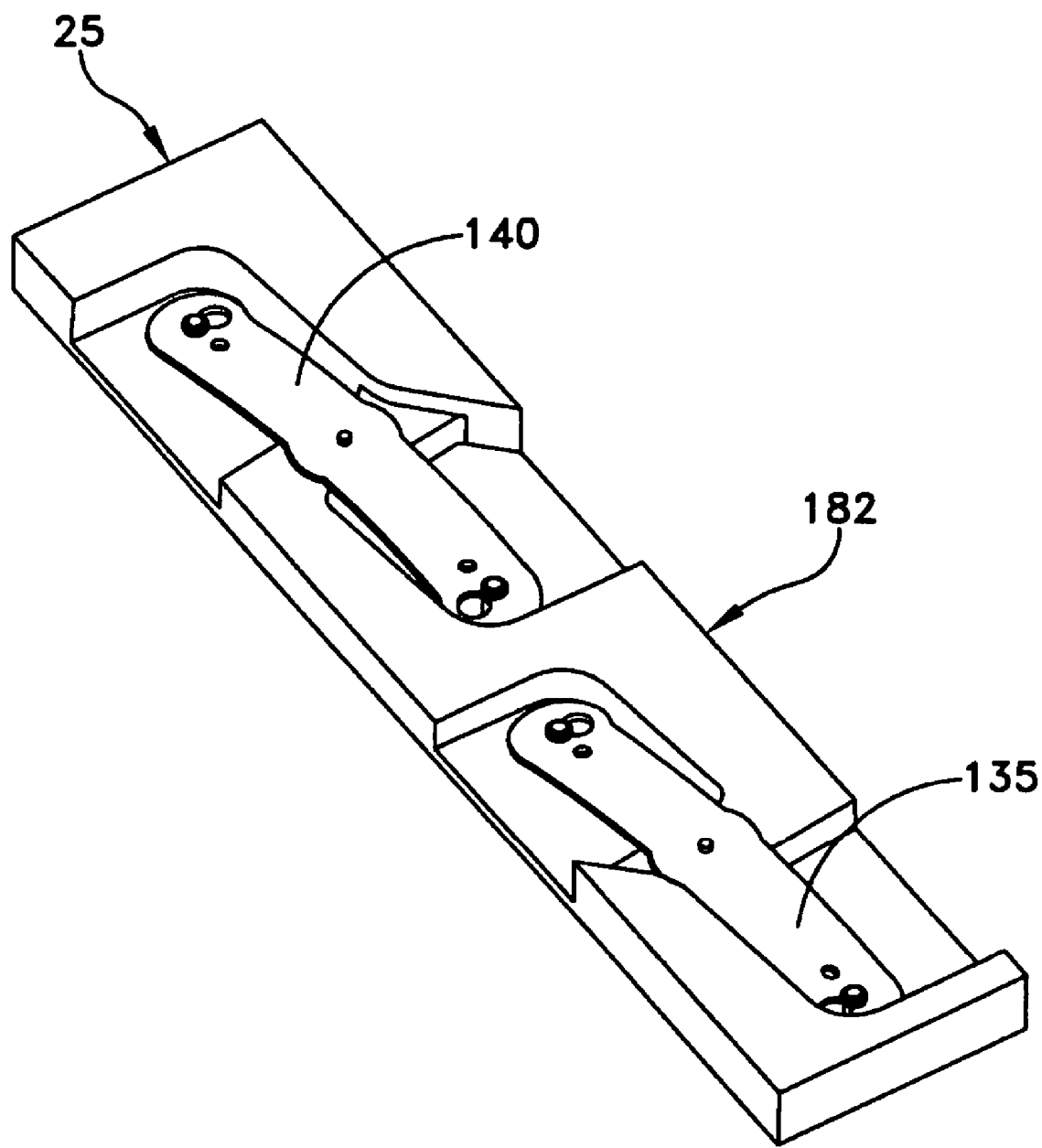
FIG. 8 illustrate a portion of the waterblock cooling device with spring components for compression of clamp pate and waterblock cooling device to printed circuit board as shown in FIGS. 1, 2 and 4.
Figure 9:
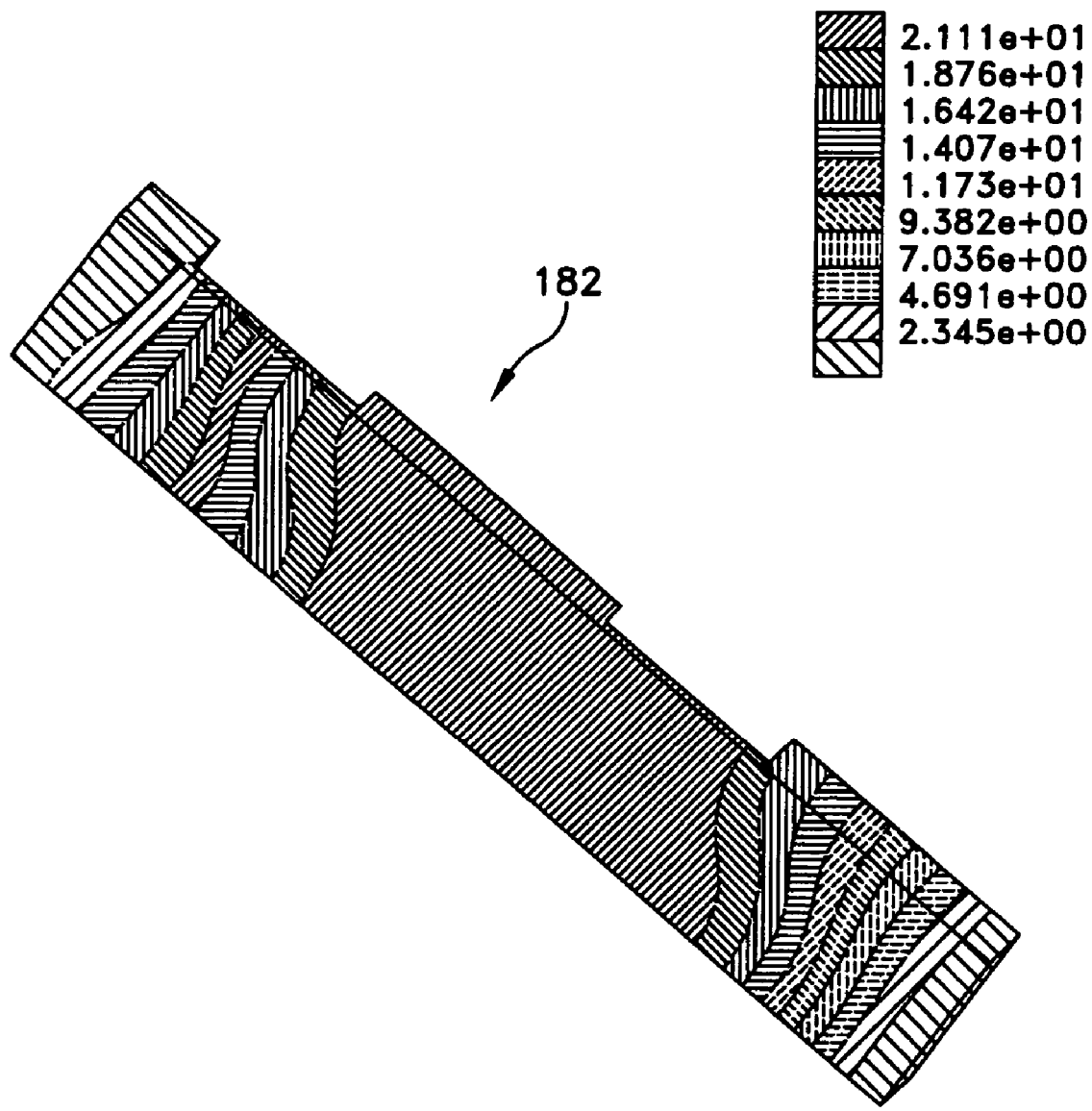
FIG. 9 illustrates thermal FEA model for the portion of the waterblock cooling device shown in FIG. 8.
Figure 10:
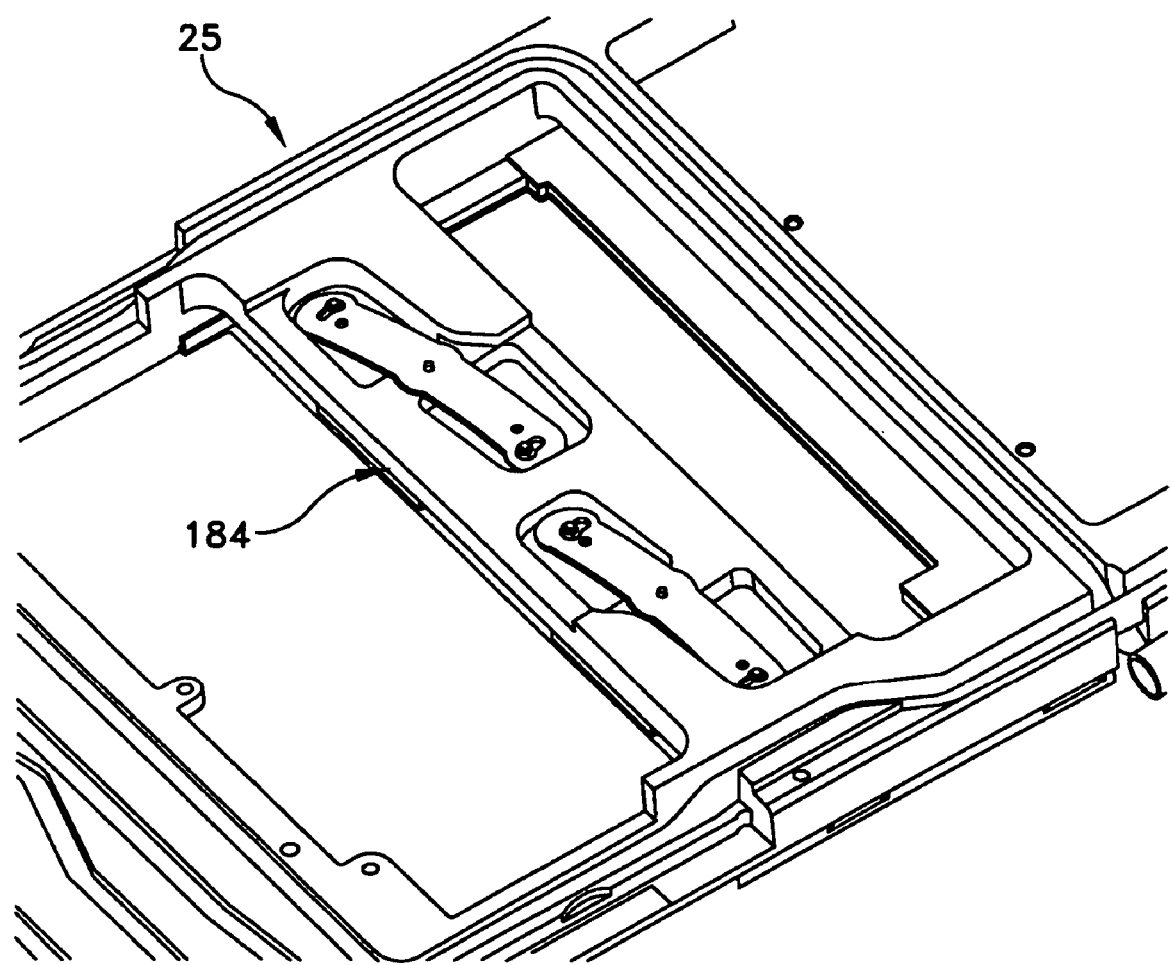
FIG. 10 illustrates another embodiment of the present invention in which there is provided a thicker portion having a greater cross-sectional depth than the portion of waterblock cooling device as shown in FIG. 8.
Figure 11:
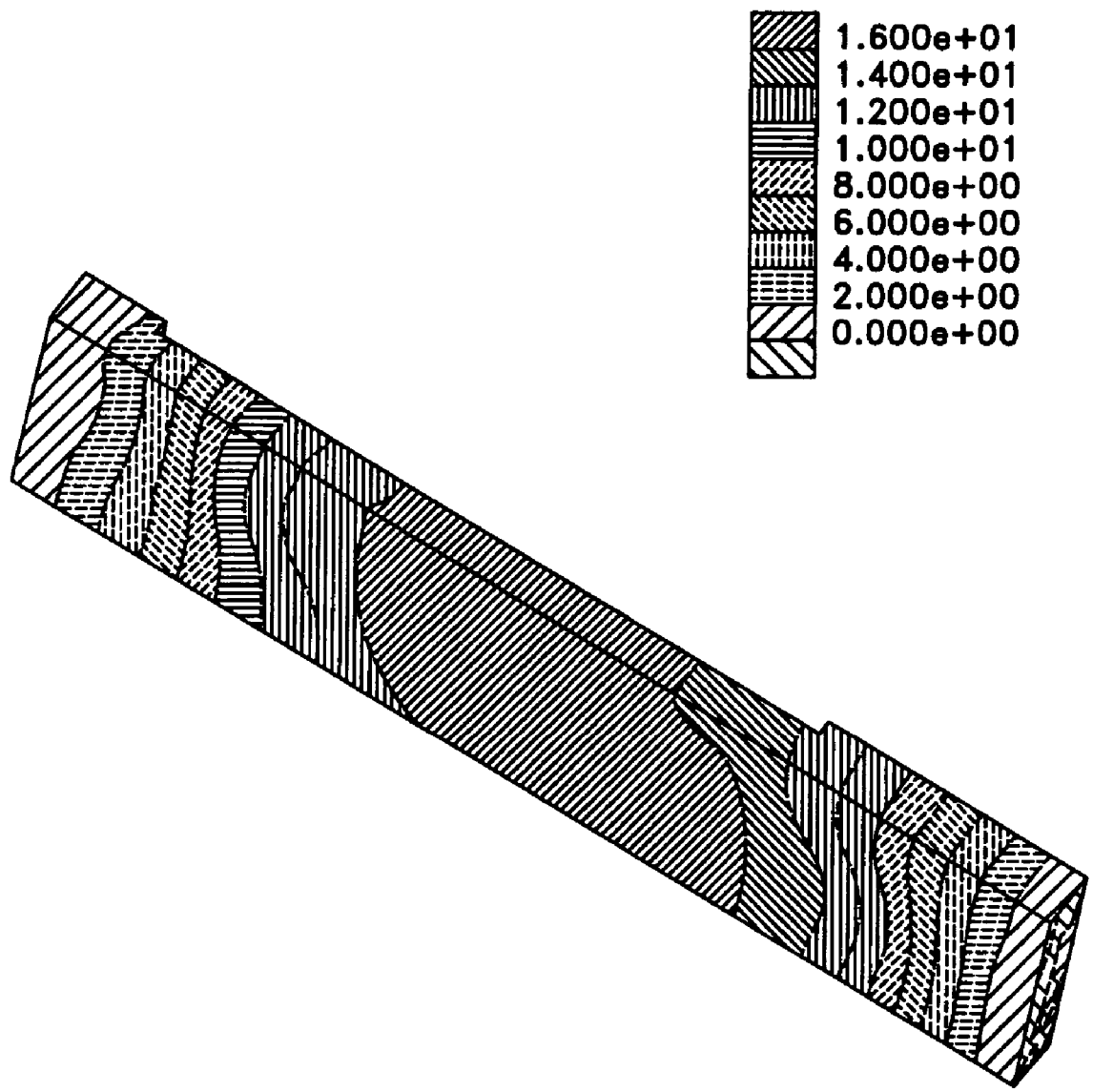
FIG. 11 illustrates the thermal FEA model for thicker portion as shown in FIG. 10.

Looking at FIG. 8, there is shown a portion 182 of waterblock cooling device 25 with first spring component 135 and second spring component 140 for compression of clamp plate 20 and waterblock cooling device 25 to printed circuit board 15. Portion 182 has a thinner cross-sectional depth than a portion 184 of waterblock cooling device 25 as shown in FIG. 10. A thermal FEA model for portion 182 is shown in FIG. 9. A thermal FEA model for portion 184 is shown in FIG. 11. The thermal performance of waterblock cooling device 25 with portion 182 is generally inferior to the screw-type waterblock cooling device 25, so extra material is provided in the waterblock cooling device 25 until the adequate performance is achieved. Because waterblock cooling device 25 in portion 184 is generally dimensionally constrained on the top and bottom, extra material is preferably added to the sides.

In one embodiment of the present invention, waterblock cooling device 25 is attached to printed circuit assembly 15 using screws (not shown) through screw holes 185. The torque of the screws is used to establish the clamping pressure. This clamping pressure must be high enough to create good thermal contact between printed circuit board 15 and component surfaces 45 and related thermal transfer pads of components 10 and the clamping pressures must be low enough to avoid damaging either one of components 10, printed circuit board 15 or the solder bond between them.

While controlling the torque applied to each of the screws is generally simple, the clamping force created by the screws is generally erratic due to the variability of conditions. These conditions may include surface roughness of the threads and other surfaces that touch the screws. The torque and ensuing clamp pressure is generally set toward a low amount so as to avoid component damage. In addition, there may be concerns that the assembly will be non-planar unless a specific torque sequence is followed. The use of a torque sequence may be prone to operator error.

The low torque of the screws in turn creates a risk of loosening during normal usage. A wicking thread lock compound may be added after the application of a desired amount of torque to the screws. The use of a lock compound generally creates safety concerns in addition to the risk of using too much thread locker so as to prevent disassembly for repair operations.

A desired amount of torque is generally too low to be applied reliably by electric screwdrivers of the type normally used in assembly. Special manual torque drivers are typically required.

As discussed above, there are several disadvantages in the use of screws with the embodiment of waterblock cooling device 25 having screw holes 185. In summary, these disadvantages include the nuisance of manual torque pairting, the high variation of clamping pressure, the risk of screws loosening, the safety risk of using liquid thread locking compound, and the risk of creating non-repairable assemblies.

In a preferred embodiment of the invention, the heat sinks, which include clamp plate 20 and waterblock cooling device 25, are clamped to printed circuit board 15 both beneath and to the top of components 10 with very little variation in clamping force using spring components 135 and 140. By using heat sink assembly 5 with spring components 135 and 140, the heat sinks of clamp plate 20 and waterblock cooling device 25 are easily removable as needed for repair of printed circuit assembly 15.

Spring components 135 and 140 allow thermal expansion and/or contraction of components 10 and printed circuit assembly 15. As such, any thermal expansion and/or contraction may create, at most, a negligible change in clamp pressure and thermal conductance through the thermal interface material and into waterblock cooling device 25. Operator assembly error is very unlikely using heat sink assembly 5.

Clamping pressure is provided by the design of spring components 135 and 140 together with standoffs 75 and 80 of clamp plate 20 and clearance holes 105 and 110 of waterblock cooling device 25. Spring components 135 and 140 are designed as leaf springs in which, after assembly, the amount of applied stress is either at or beyond the yield strength of the material. This configuration of the spring components 135 and 140 together with standoffs 75 and 80 of clamp plate 20 and clearance holes 105 and 110 of waterblock cooling device 25 provides clamping pressure after assembly which is extremely consistent.

Standoffs 75 and 80 of clamp plate 20 and clearance holes 105 and 110 of waterblock cooling device 25 are designed as mating parts configured to prevent overstressing and subsequent relaxation of clamping force provided by spring components 135 and 140. In addition, clamp plate 20 and waterblock cooling device 90 are preferably designed as mating parts configured to prevent assembly of spring component 135 with its wrong side up. Standoffs 75 and 80 of clamp plate 20 and clearance holes 105 and 110 of waterblock cooling device 25 may be positioned offset from a centerline of the spring so as to allow only assembly in a single orientation.

Figure 13:
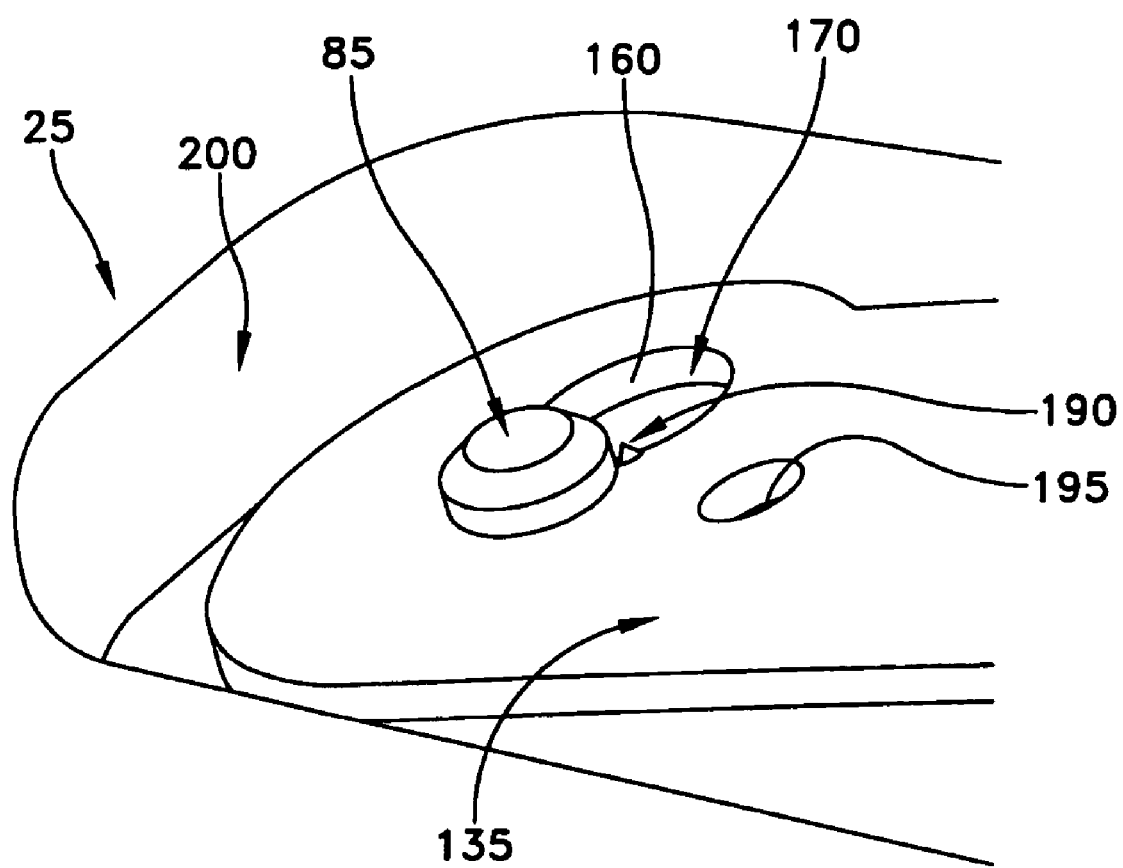
FIG. 13 illustrates the spring component shown in FIG. 12 disposed within a pocket of waterblock cooling device and in attachment to a standoff extending from the clamp plate.

Looking at FIGS. 12 and 13, one or both of keyhole cutout 155 and keyhole cutout 160 may be provided with a locking feature 190 to prevent accidental disengagement of spring component 135 from clamp plate 20. Locking feature 190 preferably comprises a sharp point or tip 190, referred to as a locking nib 190, located on an edge of keyhole cutout 155 of spring component 135. Locking nib 190 is configured on keyhole cutout 155 to prevent post-assembly disengagement of spring component 135 from standoff 75. The clamping force is large enough such that shock and vibration will not dislodge spring component 135 from standoff 75.

In a preferred embodiment of the present invention (not shown), one or more locking nibs are disposed adjacent to keyhole cutout 160 in addition to locking nib 190 disposed adjacent to keyhole cutout 155. In another preferred embodiment of the present invention (not shown), multiple locking nibs are disposed adjacent to one or both of keyhole cutout 155 and keyhole cutout 160. In another preferred embodiment of the present invention (not shown), locking nibs extend away from both sides of spring component 135.

Figure 14:
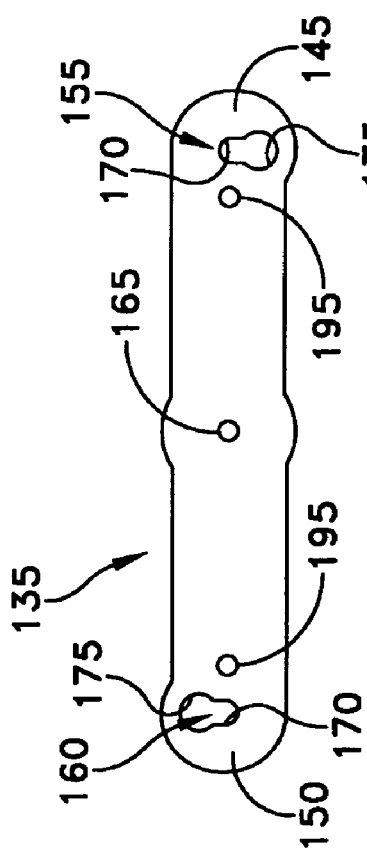
FIG. 14 illustrates a plan view of an exemplary spring component prior to assembly with the waterblock device and the clamp plate.
Figure 15:
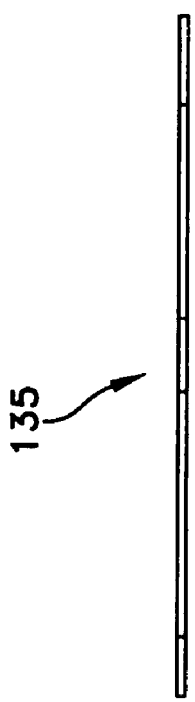
FIG. 15 illustrates an elevational view of the spring component as shown in FIG. 14, in which the spring component has a substantially flat profile prior to assembly.

Looking at FIGS. 12–14, spring component 135 may include a pair of additional holes 195 therein for the engagement of an assembly tool (not shown).

Looking at FIGS. 14–17, spring component 135 is either flat (see FIG. 15) or curved concave upward (see FIG. 16) after fabrication and prior to installation and prior to installation. Spring component 135 does not have to be flat after fabrication. As spring component 135 does not have to be perfectly flat, a significant amount of expense can be avoided in the fabrication of the spring.

Figure 16:
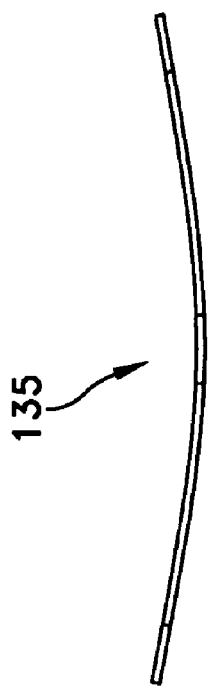
FIG. 16 illustrates an elevational view of the spring component as shown in FIG. 14, in which the spring component has an upwardly convex profile prior to assembly.
Figure 17:
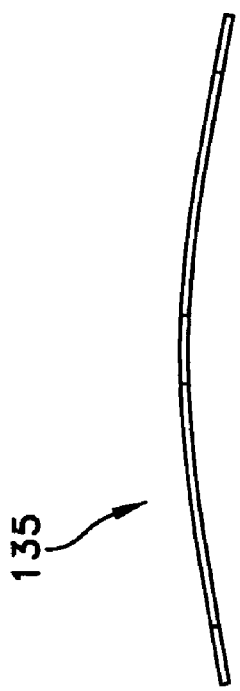
FIG. 17 illustrates an elevational view of the spring component subsequent to assembly, in which the spring component has a downwardly convex profile.

The combination of the shape and the yield strength of the material of spring component 135, as discussed herein above, assure that spring component 135 is on the verge of being permanently bent after installation as shown in FIG. 17. If spring component 135 is received in an allowed bent condition, i.e. the concave upward configuration as shown in FIG. 16, spring component 135 is in turn permanently bent, or straightened, by the bending that happens during the assembly operation. This configuration permits spring component 135 to create approximately the same load as if it were produced substantially flat, and this load is well within the necessary clamping parameters of the present invention.

Looking at FIGS. 1, 2 and 4, waterblock cooling device 25 is preferably configured with pockets 200 in which first end 145 and second end 150 of spring component 135 are positioned during assembly. Pockets 200 are preferably designed to prohibit any over bending of spring component 135 during assembly and allow spring component 135 to produce a desired amount of clamping force. If spring component 135 is allowed to bend prior to final assembly more acutely than shown in FIG. 17, for example, it is possible that spring component 135 will end up bent in the wrong direction. After assembly operation, it would then create less than the desired loads.

Figure 18:
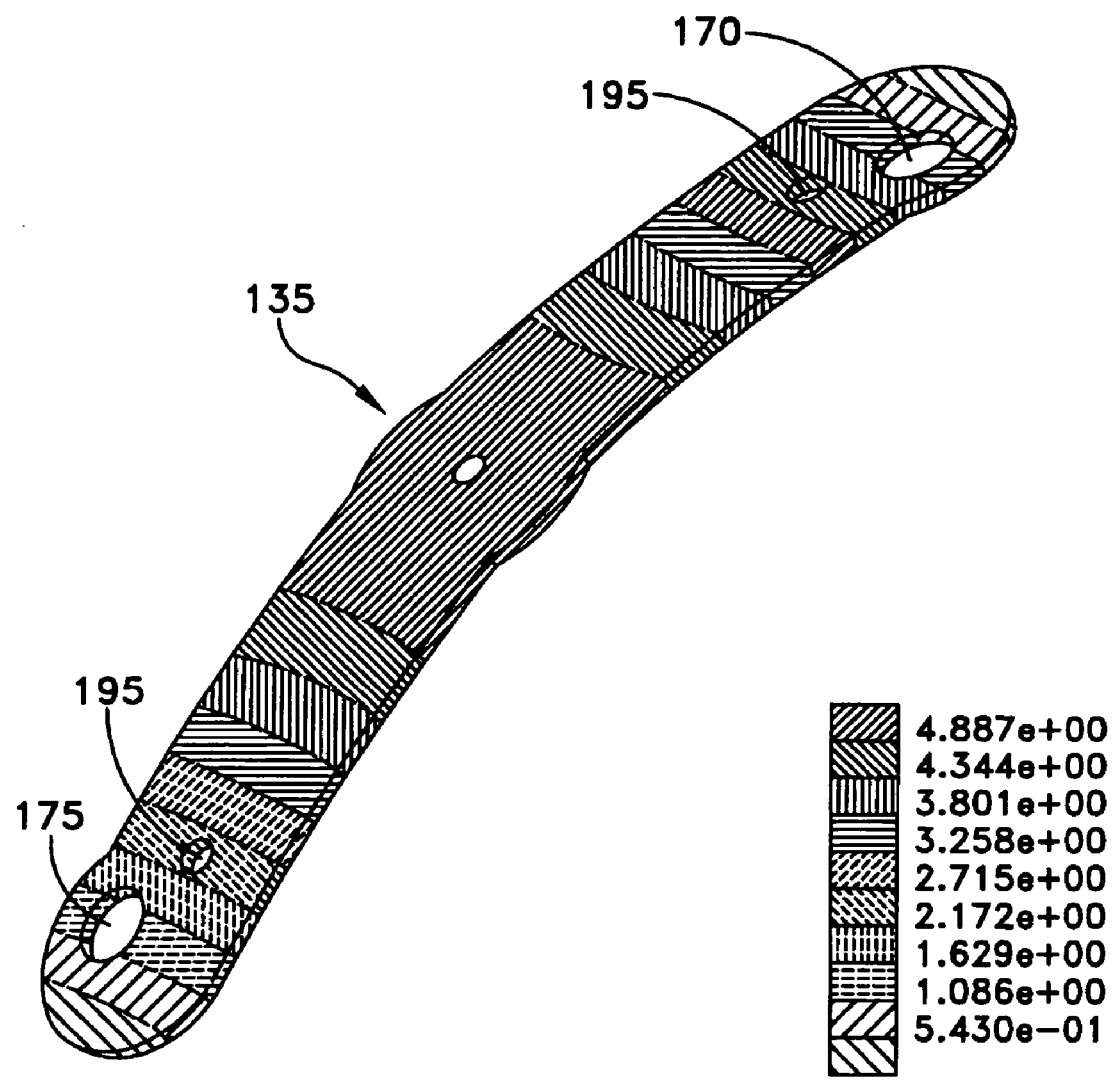
FIG. 18 illustrates the results of Finite Element Analysis (FEA) modeling of the expected deflection of spring component.
Figure 19:
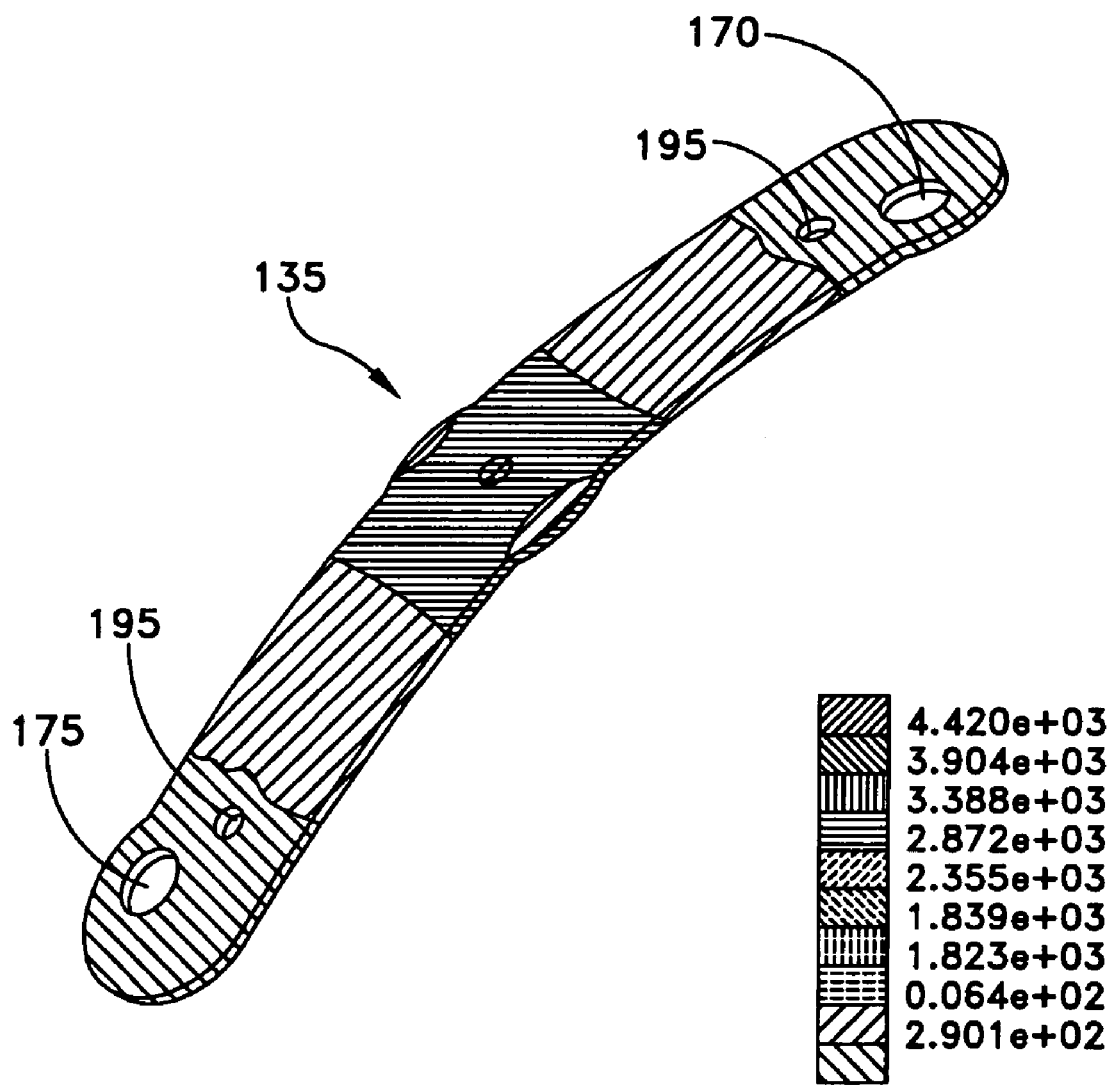
FIG. 19 illustrates the results of Finite Element Analysis (FEA) modeling of the expected internal stresses of spring component.

Looking at FIGS. 18 and 19, there is shown the results of Finite Element Analysis (FEA) modeling of spring component 135. FIG. 18 illustrates the expected deflection of spring component 135. FIG. 19 illustrates the expected internal stresses of spring component 135.

Formation of heat sink assembly 5 is very quick and easy. Only a slight rotation is needed after loading force into spring component 135. Holes 195 in spring may be provided for the use of a tool to aid in installation of the spring component 135. Generally, disassembly requires application of a force to rotate spring assembly 135 to remove from the first pair of standoffs 75.

Heat sink assembly 5 having spring component 135 and spring component 140 provides ease of assembly with at least equivalent or better thermal performance to the screw-type heat sink assembly 5. Spring component 135 features a rotating action for engagement of clamp plate 20 and waterblock cooling device 25 with the printed circuit board 15. Central hole 165 engages with a machined post of standoff 75 so as to provide positive positioning. Spring component 135 is preferably fabricated in a substantially flat state, and is subsequently curved under load. This configuration typically allows easier fabrication, and often results in a more consistent product. Spring component 135 is locked to standoffs 75 protruding from clamp plate 20, which is on the opposite side of printed circuit board 15. Keyhole cutout 155 and keyhole cutout 160 together provide a configuration to pair spring component 135 on standoffs 75. Keyhole cutout 155 and keyhole cutout 160 also allow spring component 135 to be locked in place with a small rotation.

Operation of the spring-type heat sink assembly 5 preferably comprises the following steps. Standoffs 75 and standoffs 80 of clamp or pressure plate 20 are inserted through passage holes 50 and passage holes 55 in printed circuit board, and through clearance holes 105 and clearance holes 110 in waterblock cooling device 25, respectively. Spring component 135 and spring component 140 are placed on central retainer 115 and center retainer 120, with standoffs 75 and standoffs 80 lined up to keyhole cutouts 155 and keyhole cutouts 160, respectively. End 145 and end 150 of each spring component 135 and spring component 140 are depressed until smaller portion 175 of each one of keyhole cutout 155 and keyhole cutout 160 may be rotated onto small diameter portion 90, or attachment portion 90, of each standoff 75 and standoff 80. Each one of spring component 135 and spring component 140 is then rotated to engage small diameter portion 90 of each standoff 75 and standoff 80, and then released.

In a preferred embodiment of the present invention, the majority of the heat flows out of the clamped printed circuit board through waterblock cooling device 25. This configuration is chosen in that the particular processors are designed to enable very efficient heat flow out of their tops instead of through the circuit connections, the board, and into a heat sink on the opposite side of the board. Clamp plate 20 is preferably configured to also remove heat from processors 10 in a preferred embodiment of the present invention. The heat removed by clamp plate 20 is generally may be more or less than the heat removed through waterblock cooling device 25, depending on the orientation of component 10. Preferably, clamp plate 20 is also a heat sink for other parts on printed circuit board 15. As discussed above, and in one embodiment, thermal interface material 180, which is provided at outer location 183, contacts portions of clamp component 20 so as to enable clamp component 20 to cool printed circuit board 15.

What is claimed is:

1. A heat sink assembly for cooling a component, the heat sink assembly comprising:
    a first clamp plate having a pair of standoffs, the pair of standoffs extending from a side of the first clamp plate that is configured to mate to a first side of a printed circuit board on which the component is mounted;
    a second clamp plate having a side that is configured to mate to a second side of the printed circuit board, the second clamp plate having a pair of holes therein to receive the pair of standoffs extending from the first clamp plate; and
    a spring component having a pair of holes to receive the pair of standoffs, the spring component being retained by the second clamp plate at a location between the pair of holes of the spring component, the spring component retaining the pair of standoffs to clamp the printed circuit board between the first clamp plate and the second clamp plate;
    wherein at least one of the clamp plates is configured to contact the component and sink heat from the component.

2. A heat sink assembly according to claim 1 wherein the first clamp plate comprises a waterblock cooling device.

3. A heat sink assembly according to claim 1 wherein the second clamp plate comprises a waterblock.

4. A heat sink assembly according to claim 1 further comprising the printed circuit board, wherein the printed circuit board has a first side and a second side in opposition to one another, a top portion of the component extends outwardly from the first side of the printed circuit board, and the printed circuit board forms a first pair of passage holes therethrough between the first side and the second side, and the printed circuit board forms a second pair of passage holes therethrough between the first side and the second side wherein the first clamp plate having a third side and a fourth side in opposition to one another, the first pair of standoffs comprise a first standoff and a second standoff, a second pair of standoffs extend from the side of the first clamp plate, the second pair of standoffs comprise a third standoff and a fourth standoff, each one of the first pair of standoffs and the second pair of standoffs extending outwardly from the clamp plate, each one of the first pair of standoffs and the second pair of standoffs has a terminal end disposed away from the third side of the clamp plate, and each one of the first pair of standoffs and the second pair of standoffs has an attachment portion between the terminal end thereof and the clamp plate, the third side of the clamp plate and the second side of the printed circuit board are configured for disposition toward one another so as to position the first pair of standoffs through the first pair of passage holes of the printed circuit board and position the second pair of standoffs through the second pair of passage holes of the printed circuit board;
    wherein the second clamp plate comprises a waterblock cooling device having a fifth side and a sixth side in opposition to one another, the pair of holes of the waterblock cooling device forms a first pair of clearance holes therethrough between the fifth side and the sixth side, the waterblock cooling device forms a second pair of clearance holes therethrough between the fifth side and the sixth side, the first pair of clearance holes configured to allow the terminal end of each one of the first pair of standoffs of the clamp plate to pass therethrough, the second pair of clearance holes configured to allow the terminal end of each of the second pair of standoffs of the clamp plate to pass therethrough, a first central retainer extends away from the fifth side of the waterblock cooling device, a second central retainer extends away from the fifth side of the waterblock cooling device, a terminal end of the first central retainer disposed away from the waterblock cooling device, a terminal end of the second central retainer disposed away from the waterblock cooling device, the first central retainer disposed between the first pair of clearance holes, the second central retainer disposed between the second pair of clearance holes; and wherein the spring component comprises a first spring component and a second spring component, each of the first spring component and the second spring component has a first end and a second end in opposition to one another, each of the first spring component and the second spring component forms a first keyhole cutout adjacent the first end, a second keyhole cutout adjacent the second end, and a central hole between the first keyhole cutout and the second keyhole cutout, the first keyhole cutout and the second keyhole cutout each has a first portion and a second portion, the first portion forms a first given opening, the second portion forms a second given opening, and the first given opening sized larger than the second given opening, the central hole of the first spring configured to receive therethrough the terminal end of the first central retainer, the first keyhole cutout of the first spring component configured to receive therethrough the terminal end of one of the first pair of standoffs, the second keyhole cutout of the first spring configured to receive therethrough the terminal end of another one of the first pair of standoffs, the central hole of the second spring configured to receive therethrough the terminal end of the second central retainer, the first keyhole cutout of the second spring configured to receive therethrough the terminal end of one of the second pair of standoffs, and the second keyhole cutout of the second spring configured to receive therethrough the terminal end of another one of the second pair of standoffs.

5. A heat sink assembly according to claim 4 wherein the first keyhole cutout of the first spring comprises a locking feature to selectively allow disengagement of the first spring component and the one of the first pair of standoffs.

6. A heat sink assembly according to claim 4 wherein the locking feature comprises a nib extending from a surface of the first spring component adjacent to the first keyhole cutout.

7. A heat sink assembly according to claim 4 wherein each of the first spring component and the second spring component further each comprise a first assembly tool engagement hole and a second assembly tool engagement hole, the first assembly tool engagement hole configured between the first keyhole cutout and the central hole, and the second assembly tool engagement hole configured between the second keyhole cutout and the central hole, wherein the first assembly tool engagement hole and the second assembly tool engagement hole are configured for engagement with an assembly tool so as to allow placement without using fingers of a user.

8. A heat sink assembly according to claim 4 wherein the attachment portion of the clamp portion is a necked down region between the terminal end and the third side of the clamp plate.

9. A heat sink assembly according to claim 1 wherein at least one hole of one of the first pair of passage holes and the second pair of passage holes comprises an outer perimeter surrounded by the printed circuit board.

10. A heat sink assembly according to claim 1 wherein at least one hole of one of the first pair of passage holes and the second pair of passage holes comprises a slot extending to an outer perimeter of the printed circuit board.

11. A heat sink assembly according to claim 4 wherein at least one hole of one of the first pair of clearance holes and the second pair of clearance holes comprises an outer perimeter surrounded by the waterblock cooling device.

12. A heat sink assembly according to claim 4 wherein at least one hole of one of the first pair of clearance holes and the second pair of clearance holes comprises a slot extending to an outer perimeter of the waterblock cooling device.

13. A heat sink assembly according to claim 4 wherein the first spring component comprises a substantially flat cross-section between the first end and the second end thereof prior to attachment to the waterblock cooling device and the clamp plate.

14. A heat sink assembly according to claim 13 wherein the first spring component is configured to deform from the substantially flat cross-section to a curved cross-section between the first end and the second end thereof subsequent to attachment to the clamp plate and the waterblock cooling device so as to apply a clamping force between the clamp plate and the waterblock cooling device.

15. A heat sink assembly according to claim 13 wherein the deformation to the curved cross-section comprises application of a stress equal to at least the yield strength of the first spring component.

16. A heat sink assembly according to claim 13 wherein the first central retainer of the waterblock and the first pair of standoffs of the clamp plate are configured to mate with one another so as to prevent overstressing of first spring component and prevent subsequent relaxation of the clamping force between the clamp plate and the waterblock cooling device.

17. A heat sink assembly according to claim 4 wherein the first spring component comprises a curved cross-section between the first end and the second end thereof prior to attachment to the waterblock cooling device and the clamp plate.

18. A heat sink system for cooling a component, the heat sink system comprising:
 a printed circuit board having a first side and a second side in opposition to one another, a top portion of the component extending outwardly from the first side of the printed circuit board;
 a clamp plate having a third side and a fourth side in opposition to one another, wherein the third side of the clamp plate and the second side of the printed circuit board are configured for disposition toward one another;
 a waterblock cooling device having a fifth side and a sixth side in opposition to one another; and
 a force attachment component configured to attach the clamp plate and the waterblock cooling device to one another with the first side of the printed circuit board in contact with the waterblock cooling device and the second side of the printed circuit board in contact with the clamp plate.

19. A heat sink assembly according to claim 18 wherein the force attachment component comprises at least one spring component.

20. A heat sink assembly according to with claim 18 wherein the force attachment component comprises at least two spring components.

21. A heat sink assembly according to with claim 18 wherein the force attachment component comprises at least two screws.

22. A heat sink assembly for cooling a component, the heat sink assembly comprising:
 a printed circuit board having a first side and a second side in opposition to one another, a top portion of the component extending outwardly from the first side of the printed circuit board, and the printed circuit board forming a pair of passage holes therethrough between the first side and the second side;

a clamp plate having a third side and a fourth side in opposition to one another, a first standoff and a second standoff each extending outwardly from the clamp plate, each of the first standoff and the second standoff having a terminal end disposed away from the third side of the clamp plate, and each of the first standoff and the second standoff having an attachment portion between the terminal end thereof and the clamp plate, wherein the third side of the clamp plate and the second side of the printed circuit board are configured for disposition toward one another so as to position the first standoff and the second standoff through the pair of passage holes of the printed circuit board;

a waterblock cooling device having a fifth side and a sixth side in opposition to one another, the waterblock cooling device forming a pair of clearance holes therethrough between the fifth side and the sixth side, the pair of clearance holes configured to allow the terminal end of each of the first standoff and the second standoff of the clamp plate to pass therethrough, a central retainer extending away from the fifth side of the waterblock cooling device, a terminal end of the central retainer disposed away from the waterblock cooling device, a terminal end of the second central retainer disposed away from the waterblock cooling device, the first central retainer disposed between the pair of clearance holes; and a spring component having a first end and a second end in opposition to one another, the spring component forming a first keyhole cutout adjacent the first end, a second keyhole cutout adjacent the second end, and a central hole between the first keyhole cutout and the second keyhole cutout, the first keyhole cutout and the second keyhole cutout each having a first portion and a second portion, the first portion forming a first given opening, the second portion forming a second given opening, and the first given opening sized larger than the second given opening, the central hole of the spring configured to receive therethrough the terminal end of the central retainer, the first keyhole cutout of the spring component configured to receive therethrough the terminal end of the first standoff, and the second keyhole cutout of the spring configured to receive therethrough the terminal end of the second standoff.

23. A method for connecting together a heat sink assembly and a component, the method comprising:

inserting standoffs of a clamp plate through passage holes in a printed circuit board;

inserting the standoffs of the clamp plate through clearance holes in a waterblock cooling device; and positioning a spring component in contact with the clamp plate and the waterblock cooling device so as to position one side of the printed circuit board in contact with the waterblock cooling device and the other side of the printed circuit board in contact with the clamp plate.

* * * * *